United States Patent
Onoda et al.

(10) Patent No.: US 6,412,501 B1
(45) Date of Patent: Jul. 2, 2002

(54) DRYING APPARATUS AND DRYING METHOD

(75) Inventors: Hajime Onoda; Kazutoshi Watanabe; Hiroki Takahashi, all of Ushiku (JP)

(73) Assignee: Kimmon Quartz Co., Ltd., Tokyo (JP)

( * ) Notice: Subject to any disclaimer, the term of this patent is extended or adjusted under 35 U.S.C. 154(b) by 0 days.

(21) Appl. No.: 09/527,840

(22) Filed: Mar. 17, 2000

(30) Foreign Application Priority Data

| Jun. 29, 1999 | (JP) | ............................................ 11-183469 |
| Feb. 10, 2000 | (JP) | ....................................... 2000-033504 |

(51) Int. Cl.$^7$ ................................................. B08B 3/10
(52) U.S. Cl. ...................... 134/95.2; 134/108; 134/902; 134/102.1; 34/469; 34/443
(58) Field of Search ................................ 134/95.2, 105, 134/108, 902, 102.1; 34/471, 470, 467, 468, 469, 443

(56) References Cited

U.S. PATENT DOCUMENTS

| 3,923,541 A | * | 12/1975 | Healy ........................... 134/902 |
| 5,884,640 A | * | 3/1999 | Fishkin et al. .............. 134/95.2 |
| 5,934,299 A | * | 8/1999 | Akatsu et al. ................ 134/105 |
| 5,938,857 A | * | 8/1999 | Fujiwara et al. .......... 134/102.1 |
| 5,940,985 A | * | 8/1999 | Kamikawa et al. ............ 34/471 |
| 5,950,646 A | * | 9/1999 | Horie et al. ................. 134/902 |
| 5,951,779 A | * | 9/1999 | Koyanagi et al. ........... 134/95.2 |
| 6,001,191 A | * | 12/1999 | Kamikawa et al. .......... 134/902 |
| 6,045,624 A | * | 4/2000 | Kamikawa et al. .......... 134/902 |
| 6,050,275 A | * | 4/2000 | Kamikawa et al. .......... 134/105 |
| 6,082,381 A | * | 7/2000 | Kamikawa et al. ........ 134/95.2 |
| 6,108,928 A | * | 8/2000 | Park et al. ................... 134/902 |
| 6,143,087 A | * | 11/2000 | Walter ........................... 134/10 |
| 6,145,519 A | * | 11/2000 | Konish et al. ............... 134/902 |
| 6,152,153 A | * | 11/2000 | Takase et al. ................ 134/902 |
| 6,045,621 A1 | * | 4/2001 | Puri et al. .................... 134/902 |
| 6,216,364 B1 | * | 4/2001 | Tanaka et al. ................. 34/471 |

FOREIGN PATENT DOCUMENTS

| JP | 1-198032 | * | 8/1989 | .................. 134/902 |
| JP | 4-313227 | * | 11/1992 | .................. 134/902 |

* cited by examiner

*Primary Examiner*—Frankie L. Stinson
(74) *Attorney, Agent, or Firm*—Frishauf, Holtz, Goodman & Chick, P.C.

(57) ABSTRACT

A drying apparatus comprises a drying vessel, a treatment liquid feeder-discharger for feeding pure water into the drying vessel, a vapor supplier for supplying an organic solvent vapor to the space over the pure water, inert gas suppliers for supplying an inert gas with which the organic solvent vapor is diluted, and a heated organic solvent supplier for forming a film of the organic solvent on a liquid level of the pure water. After the wafer is immersed in the pure water, the pure water is gradually discharged from the drying vessel by means of the treatment liquid feeder-discharger. Since the wafer passes through the organic solvent film as it is exposed above the liquid level, the organic solvent of the film adheres to the surface of the wafer, and the organic solvent vapor is condensed on the surface of the wafer that is exposed above the liquid level.

8 Claims, 7 Drawing Sheets

DRYING APPARATUS AND DRYING METHOD

CROSS-REFERENCE TO RELATED APPLICATIONS

This application is based upon and claims the benefit of priority from the prior Japanese Patent Applications No. 11-183469, filed Jun. 29, 1999; and No. 2000-033504, filed Feb. 10, 2000, the entire contents of which are incorporated herein by reference.

BACKGROUND OF THE INVENTION

The present invention relates to a drying apparatus and a drying method for drying to-be-dried objects, such as cleaned wafers of semiconductors, substrates for liquid crystal displays, substrates for recording disks, substrates for masking, and other substrates.

Generally known are drying apparatuses for drying to-be-dried objects such as semiconductor wafers that are subjected to a cleaning process, rinse process, etc. As a typical drying apparatus, there is a so-called vapor drying apparatus that uses a vapor of an organic solvent. In the vapor drying apparatus, the organic solvent on the surface of a to-be-dried object is evaporated in a short time after a treatment liquid, such as pure water, adhering to the object surface is replaced with the organic solvent.

The vapor drying apparatus comprises an apparatus body that constitutes its outer hull, a support mechanism for supporting a wafer, a liquid recovery section, etc. The apparatus body is provided with a drying vessel that is stored with the organic solvent. Isopropyl alcohol (IPA) is used as an example of the organic solvent. A heating device is provided at the bottom of the drying vessel. The heating device produces an organic solvent vapor by heating the organic solvent. The support mechanism has a function to load into or unload the wafer, as an example of the to-be-dried object, from the drying vessel and to support the wafer in the drying vessel. The liquid recovery section discharges the treatment liquid (e.g., pure water), which flows down from the surface the wafer, to the outside of the apparatus.

Before the wafer is loaded into the drying vessel, it is cleaned with a cleaning fluid, such as hydrogen fluoride or pure water, in the cleaning process. The wafer is rinsed with the treatment liquid, such as pure water, in the rinse process after the cleaning process. Before it is inserted into the drying vessel, therefore, the wafer has the treatment liquid on its surface.

The wafer, having the treatment liquid such as pure water thereon, is inserted into the drying vessel by means of the support mechanism, and exposed to the vapor of the organic solvent such as IPA. The vapor is condensed on the surface of the wafer, and the organic solvent adheres to the wafer surface. The treatment liquid having so far been adhering to the wafer surface flows down by being replaced with the organic solvent, and is recovered by means of the liquid recovery section. The organic solvent on the wafer surface is evaporated in a short time, whereupon the wafer is dried. As the treatment liquid flows down from the surface of the wafer, particles on the wafer surface flows down together with the liquid.

If the treatment liquid contains particles in the rinse process, the particles sometimes may adhere to the rinsed wafer surface. If the wafer having the particles thereon is treated by means of the vapor drying apparatus, the particles on the wafer surface may possibly flow down together with the cleaning fluid and unfavorably remain in the drying vessel.

The wafer rinsed with the treatment liquid, e.g., pure water, is at a low temperature immediately after it is inserted into the drying vessel. Therefore, the vapor in the drying vessel is rapidly reduced as the organic solvent is quickly condensed in plenty on the wafer surface immediately after the wafer is loaded into the drying vessel. If the vapor quantity is reduced, a part of the wafer may possibly be exposed to air. Since the heating device goes on heating the organic solvent, the organic solvent vapor continues to be produced. In some cases, however, it takes scores of seconds, for example, to allow the wafer to be covered entire again.

A part of the wafer is left to dry naturally before the wafer is covered entire with the vapor. As this is done, natural oxide films or spots called watermarks inevitably develop along the respective contours of drops of the treatment liquid having been adhering to the wafer. In the case where the wafer is cleaned with hydrogen fluoride or the like in the cleaning process, in particular, the surface of the wafer is hydrophobic and activated, so that watermarks are liable to develop.

Immediately after the wafer is inserted into the drying vessel, as mentioned before, a relatively large quantity of the organic solvent is condensed in a moment on the wafer surface. Accordingly, the organic solvent should never fail to be heated in plenty to produce the vapor, so that a drying process entails high cost. Further, the conventional vapor drying apparatus requires use of a large quantity of organic solvent vapor in the drying process. In drying a large-diameter wafer, therefore, it is hard to secure sufficient organic solvent vapor to be replaced with pure water on the wafer.

BRIEF SUMMARY OF THE INVENTION

Accordingly, a first object of the present invention is to provide a drying apparatus capable of securely removing particles from the surface of a to-be-dried object, such as a wafer, and preventing watermarks from developing on the surface of the to-be-dried object. A second object of the invention is to provide a drying apparatus capable of lowering the cost of a drying process.

In order to achieve the first object described above, a drying apparatus according to the present invention comprises a drying vessel for storing a to-be-dried object, a treatment liquid feeder-discharger capable of feeding a treatment liquid into the drying vessel and discharging the treatment liquid in the drying vessel from the bottom side thereof, a heated organic solvent supplier for feeding a heated organic solvent onto the treatment liquid in the drying vessel, and a vapor supplier for feeding an organic solvent vapor into the drying vessel. Preferably, the treatment liquid feeder-discharger includes an inlet-outlet port opening in the base portion of the drying vessel, an inlet-outlet pipe connected to the inlet-outlet port, a valve, and a treatment liquid source.

In the drying apparatus of the invention, the interior of the drying vessel can be cleaned by feeding the treatment liquid such as pure water into the drying vessel by means of treatment liquid feeder-discharger and causing the pure water to overflow the top of the drying vessel. Particles can be removed from the drying vessel as the treatment liquid is discharged from the base portion of the drying vessel after the vessel is cleaned. The space over the treatment liquid in the drying vessel is filled with the vapor. The to-be-dried object is immersed in the treatment liquid. The organic solvent is condensed on the surface of the object as the object is exposed above the level of the treatment liquid. In this case, at least the lower part of the to-be-dried object is immersed in the treatment liquid before the organic solvent is condensed over the whole surface of the object, so that the temperature of the object is kept lower than that of the vapor. Thus, the organic solvent can be securely condensed on the whole surface of the object.

The drying apparatus of the invention may comprise a first inert gas supplier for introducing an inert gas into the drying vessel through the top portion thereof. Since this inert gas supplier feeds an inert gas such as nitrogen into the drying vessel, the space over the treatment liquid is filled with the organic solvent vapor and the inert gas. Since the to-be-dried object in the drying vessel is covered with the inert gas, in this case, it is restrained from touch oxygen, so that watermarks can be restrained from developing on the surface of the to-be-dried object.

In the drying apparatus of the invention, moreover, the vapor supplier may include an organic solvent tank for storing the organic solvent, heating means for heating the organic solvent in the organic solvent tank, thereby producing the organic solvent vapor, and a communicating section for feeding the organic solvent vapor in the organic solvent tank onto the treatment liquid through the top portion of the drying vessel. Further, the drying apparatus may comprise means for introducing the organic solvent heated outside the drying vessel into the organic solvent tank, in order to produce the organic solvent vapor.

For example, the heated organic solvent supplier includes a heater for heating the organic solvent, discharge means for discharging the heated organic solvent toward the treatment liquid through the top portion of the drying vessel, and organic solvent diffusing means for uniformly supplying the heated organic solvent from the discharge means to the whole level of the treatment liquid in the drying vessel, thereby forming a film of the organic solvent on the liquid level.

The drying apparatus of the invention uses pure water of, e.g., normal temperature (about 20° C.) as the treatment liquid. The organic solvent (50 to 150 cc of a liquid of 60 to 80° C.) heated in any other place than the drying vessel is discharged toward the treatment liquid level by means of the discharge means of the heated organic solvent supplier. The discharged heated organic solvent is uniformly diffused to the whole treatment liquid level by means of the diffusing means, whereupon a stable film of the organic solvent is formed on the treatment liquid level.

As the to-be-dried object immersed in the treatment liquid emerges from the treatment liquid, some of the organic solvent that forms the organic solvent film adheres uniformly and continuously to the surface of the to-be-dried object. The treatment liquid having so far been adhering to the surface of the to-be-dried object is replaced with the organic solvent and flows down. In order to form the organic solvent film on the treatment liquid level, it is necessary to give a temperature difference not smaller than a predetermined value between the treatment liquid and the organic solvent to be fed onto the treatment liquid and to feed rapidly the organic solvent in a given or larger quantity. The following is a description of the reason for this requirement.

When the organic solvent is supplied to the treatment liquid level, the treatment liquid and the solvent are mixed to form the organic solvent film. The surface tension of the organic solvent film is lower than that of a treatment liquid level that contains no organic solvent. Accordingly, the surface tension between the organic solvent film and the treatment liquid level has a gradient. On the treatment liquid level, therefore, the organic solvent is pulled strongly by the treatment liquid level that contains no organic solvent. Thus, the organic solvent quickly diffuses onto the whole treatment liquid level, whereupon the film is formed containing the organic solvent. This film that contains the organic solvent is referred to as the organic solvent film herein.

The lower the treatment liquid temperature and the larger the temperature difference between the treatment liquid and the organic solvent, the greater the gradient of the surface tension is. The greater the surface tension gradient, the faster the organic solvent diffuses to form the thin organic solvent film with a uniform thickness. The organic solvent film, formed on the treatment liquid level in this manner, serves to prevent the organic solvent vapor from diffusing into the treatment liquid thereunder if the vapor supplied to the space over it is condensed by touching it. Thus, the treatment liquid below the film can be recovered and re-treated to be reused.

In a drying apparatus described in Jpn. Pat. Appln. KOKOKU Publication No. 6-103686, the treatment liquid used is kept at a relatively high temperature substantially equal to that of the organic solvent vapor. A drying fluid layer (layer of a mixture of the treatment liquid and the organic solvent) is formed over the treatment liquid as the organic solvent vapor is fed onto the surface of the treatment liquid. In this case, there is a small temperature difference between the treatment liquid and the organic solvent, and besides, the organic solvent cannot be supplied in plenty in a moment. Accordingly, the thin uniform film of the organic solvent cannot be formed. If the vapor or mist of the organic solvent is supplied to the space over the treatment liquid without forming the organic solvent film on the liquid level, therefore, the organic solvent inevitably diffuses into the treatment liquid without limitation.

In order to form the organic solvent film on the treatment liquid level, the drying apparatus of the present invention is provided with the organic solvent diffusing means for giving the temperature difference not smaller than the predetermined value between the treatment liquid and the organic solvent and feeding the heated organic solvent in the given or larger quantity onto the treatment liquid in a moment.

As the to-be-dried object in the drying vessel passes through the organic solvent film, the organic solvent adheres substantially uniformly to the surface of the object. Since the organic solvent vapor continues to be fed into the drying vessel, it goes on being condensed on the organic solvent film. Thus, the organic solvent film can maintain its stability without being torn.

The drying apparatus of the invention may be provided with a second inert gas supplier for introducing an inert gas into the organic solvent stored in the organic solvent tank. According to this drying apparatus, the organic solvent vapor in the organic solvent tank is diluted with the inert gas. Accordingly, the consumption of the organic solvent used in a drying process can be lowered, and the cost of the drying process can be restricted. Since the volume of the vapor that contains the organic solvent increases, moreover, the sufficient organic solvent vapor in the drying vessel can be secured to cover the to-be-dried object if much of the vapor is condensed on the surface of the object.

The drying apparatus of the invention may be provided with a holding member for holding the to-be-dried object in the drying vessel and a lifter that supports the object for up-and-down motion in the drying vessel. The lifter is raised when the liquid level is lowered to the level of the middle portion of the to-be-dried object as the treatment liquid feeder-discharger discharges the treatment liquid from the drying vessel. By doing this, the object can be separated from the holding member. As the treatment liquid is discharged from the drying vessel, the drying apparatus can prevent the liquid from remaining in the area of contact between the to-be-dried object and the holding member. Thus, production of watermarks can be prevented more securely.

The "inert gas" described herein may be any of gases that are chemically inactive and react to no organic solvent, such as argon, helium and other rare gas elements, as well as nitrogen. The "pure water" is water in which the contents of dust and other contamination are minimized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will now be described with reference to the accompanying drawings.

Figure 1:
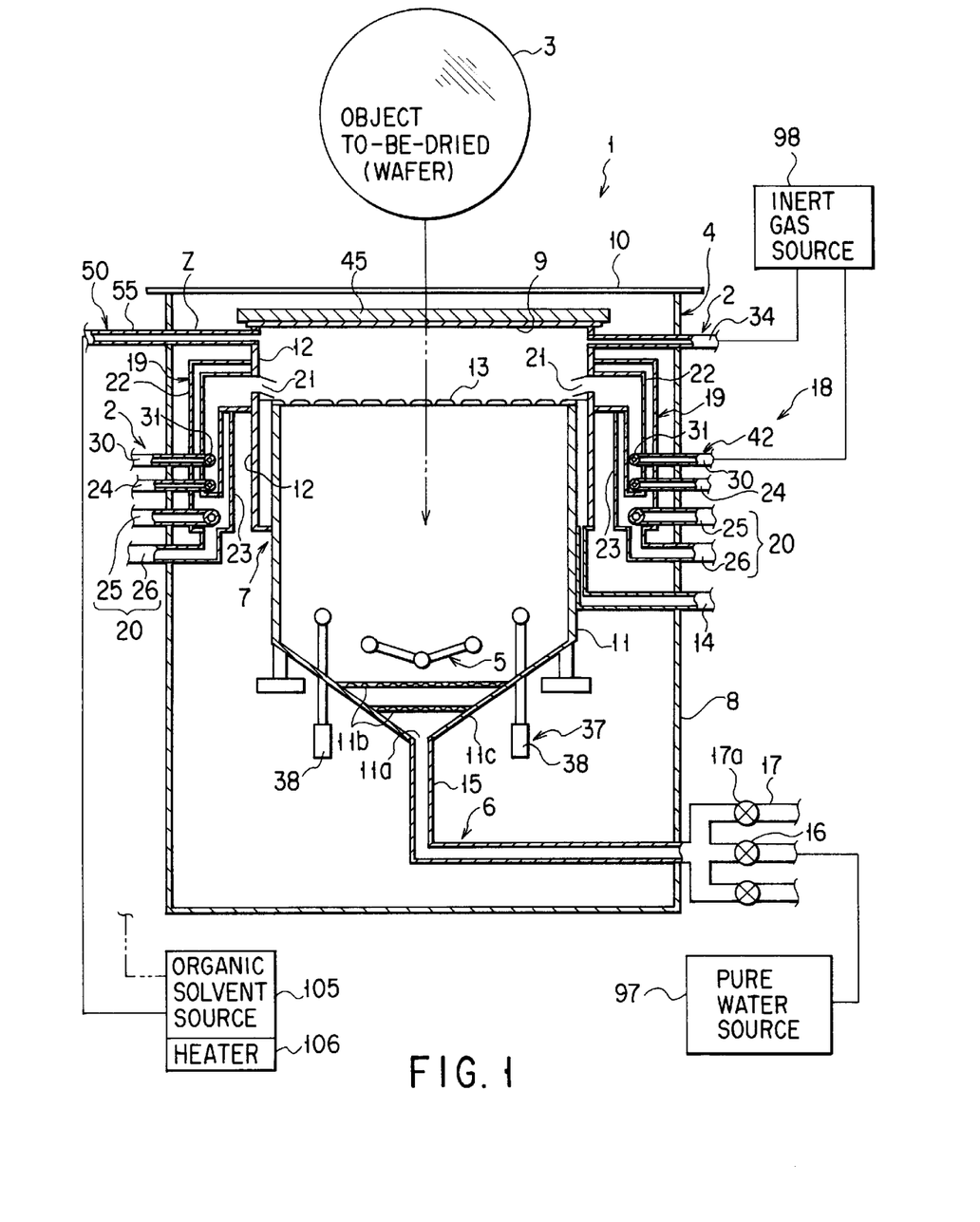
FIG. 1 is a vertical sectional view of a drying apparatus according to an embodiment of the present invention.

A drying apparatus 1 shown in FIG. 1 comprises an apparatus body 4, which includes a drying vessel 7, a box-shaped outer vessel. 8, etc., and a treatment liquid feeder-discharger 6. The drying vessel 7 is disposed in the outer vessel 8. The outer vessel 8 is formed of a stainless-steel sheet or some other material that has a relatively low heat transfer coefficient. The vessel 8 thermally cuts off the interior of the drying vessel 7 from the outside of the apparatus body 4. Openings 9 and 10 are formed in the upper parts of the drying vessel 7 and the outer vessel 8, respectively. A wafer 3 of a semiconductor can pass through the openings 9 and 10. The semiconductor wafer 3 is an example of the a to-be-dried object.

The drying vessel 7 includes a vessel body 11, in the form of a box having a base portion 11c, and an overflow tank 12 that surrounds the upper part of the vessel body 11. The vessel body 11 and the overflow tank 12 are formed of a material (e.g., quartz) that cannot be easily corroded by an organic solvent such as isopropyl alcohol.

Figure 2:
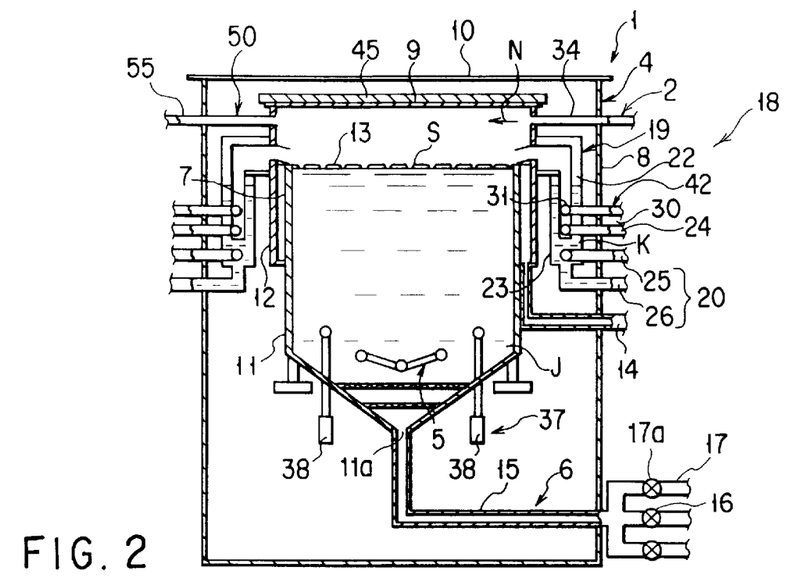
FIG. 2 is a vertical sectional view showing a treatment liquid in a drying vessel of the drying apparatus of FIG. 1.

As shown in FIG. 2, pure water J is stored in the vessel body 11. The upper end of the body 11 is formed having an opening 13 through which the wafer 3 can pass. A treatment liquid (pure water J) that overflows the opening 13 flows into the overflow tank 12. A drain pipe 14 is connected to the lower end portion of the overflow tank 12. The pipe 14 guides the pure water J from the overflow tank 12 to the outside of the drying vessel 7. A lid 45 for closing the opening 9 is provided on top of the drying vessel 7. The lid 45 is movable in the horizontal or vertical direction, for example.

The treatment liquid feeder-discharger 6 is provided with an inlet-outlet pipe 15, a valve 16 attached to the pipe 15, and a treatment liquid source 97 (shown in FIG. 1). One end of the inlet-outlet pipe 15 is connected to an inlet-outlet port 11a that is formed in the base portion 11c of the vessel body 11. Water-permeable base plates 11b are arranged over the port 11a. The other end of the pipe 15 extends through the outer vessel 8 to the outside of the apparatus body 4 and is connected to the treatment liquid source 97. The source 97 is stored with pure water as an example of the treatment liquid. The pure water can be supplied to the inlet-outlet pipe 15 by opening the valve 16. The treatment liquid feeder-discharger 6 can also discharge the pure water from the vessel body 11 to the outside of the apparatus body 4 through the port 11a and the inlet-outlet pipe 15. An exhaust pipe 17 is connected to the pipe 15 through a valve 17a.

Arranged on the top side of the drying apparatus 1 are a first inert gas supplier 2, vapor supplier 18, second inert gas supplier 42, heated organic solvent supplier 50, and transportation device 100 (shown in FIGS. 4 and 11) for transporting the wafer 3. A holding member 5 for holding the wafer 3 in the drying vessel 7 and a lifter 37 capable of up-and-down motion are arranged on the bottom side of the drying apparatus 1.

The vapor supplier 18 is provided with a tank assembly 19 of a dual structure, including an organic solvent tank 22 and a heating tank 23, and piping 20 in which a high-temperature fluid circulates. The heating tank 23 surrounds the outside of the organic solvent tank 22. The tank assembly 19 is attached to the outer peripheral surface of the overflow tank 12. A organic solvent Y (shown in FIG. 3) is stored in the tank 22. Isopropyl alcohol (IPA) is used as an example of the organic solvent Y. An organic solvent supply pipe 24 is provided at the lower part of the tank 22. The organic solvent Y is fed into the organic solvent tank 22 from outside the apparatus body 4 by means of the pipe 24. The vapor supplier 18 has a slit 21 that serves as a communicating section for connecting the upper part of the organic solvent tank 22 and the inside of the vessel body 11.

The heating tank 23 stores therein a high-temperature fluid K (shown in FIG. 2) such as hot water or heated oil. The tank 23 is connected with a fluid supply pipe 25 through which the fluid K is fed into the tank 23 and a fluid return pipe 26 through which the fluid K is discharged from the tank 23. The organic solvent Y in the organic solvent tank 22 is heated with the high-temperature fluid K that is introduced into the heating tank 23 through the supply pipe 25. The heating tank 23, high-temperature fluid K, and piping 20 serve as organic solvent heating means. The heated organic solvent Y produces a vapor V (shown in FIG. 3). As shown in FIG. 1, an organic solvent storage tank 105, which is provided with a heater 106 for use as organic solvent heating means, may be located outside the apparatus body 4. In this case, the organic solvent vapor V is produced as the organic solvent heated outside the apparatus body 4 is introduced into the organic solvent tank 22.

The slit 21 opens in the side wall of the overflow tank 12. The organic solvent tank 22 and drying vessel 7 internally communicate with each other by means of the slit 21. The slit 21 is situated above the top opening 13 of the vessel body 11. Therefore, the organic solvent vapor V produced in the tank 22 is fed into the drying vessel 7 through the slit 21.

The first inert gas supplier 2 is provided with a gas supply pipe 34. One end of the pipe 34 opens into the upper part of the drying vessel 7, that is, near the upper end of the overflow tank 12. The other end of the gas supply pipe 34 is connected to an inert gas source 98. The supplier 2 feeds a normal-temperature or heated inert gas N (shown in FIG. 2), such as nitrogen gas, into the drying vessel 7 from above it. The inert gas N that is fed from the gas source 98 into the gas supply pipe 34 jets out into the overflow tank 12 through its upper end portion as it is supplied to the upper part of the vessel body 11.

The second inert-gas supplier 42 is provided with a gas supply pipe 30, a jet pipe 31 situated above the organic solvent supply pipe 24, and gas jets (not shown) in the pipe 31. The gas jets open at given spaces in the longitudinal direction of the pipe 31. The jet pipe 31 extends along a wall that constitutes the organic solvent tank 22. One end of the gas supply pipe 30 is connected to the jet pipe 31. The other end of the gas supply pipe 30 is connected to the inert gas source 98. An inert gas N1 (shown in FIG. 6) supplied from the source 98 to the pipe 30 passes through the jet pipe 31 and jets out into the organic solvent Y in the organic solvent tank 22 through the gas jets. The vapor V of the solvent Y is diluted with the inert gas N1.

The heated organic solvent supplier 50 includes an organic solvent supply pipe 55. One end of the pipe 55 opens into the upper part of the drying vessel 7, that is, near the upper end of the overflow tank 12. The other end of the pipe 55 is connected to the organic solvent storage tank 105 (shown in FIG. 1). The tank 105 is stored with an organic solvent such as isopropyl alcohol. The tank 105 is provided with the heater 106 for heating the organic solvent.

Figures 12, 13:
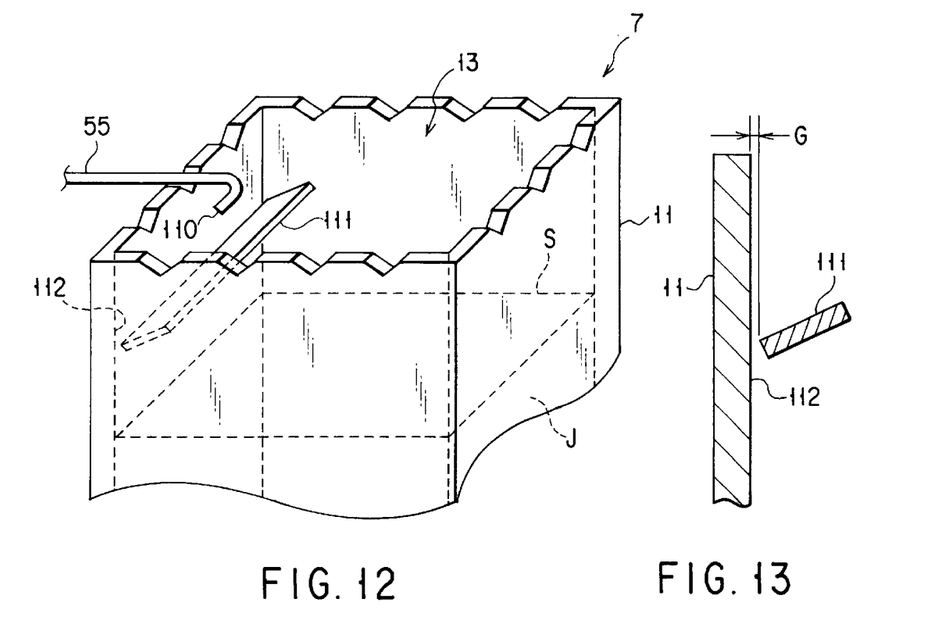
FIG. 12 is a perspective view partially showing a vessel body and a heated organic solvent supplier of the drying apparatus of FIG. 1.
FIG. 13 is a vertical sectional view partially showing the vessel body and the heated organic solvent supplier of FIG. 12.
Figure 14:
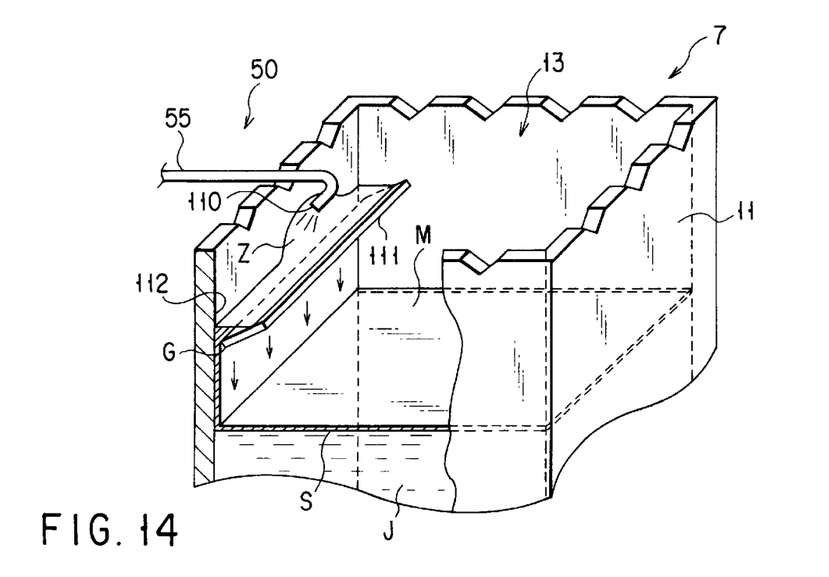
FIG. 14 is a perspective view partially showing the vessel body and the heated organic solvent supplier of FIG. 12.

As shown in FIG. 12, the drying vessel 7 is provided with a discharge port 110 of the organic solvent supply pipe 55, which functions as organic solvent discharging means, and a trough 111 for use as organic solvent diffusing means. As shown in FIG. 13, a gap G of about 0.5 mm is defined between the trough 111 and an inner wall 112 of the vessel body 11, substantially covering the overall length of the inner wall 112 in the crosswise direction. The high-temperature organic solvent heated in the organic solvent storage tank 105 is delivered to the organic solvent supply pipe 55, and is discharged into the trough 111 from above it, as shown in FIG. 14. This heated organic solvent Z is fed onto a liquid level S of the pure water J in the vessel body 11, and forms a uniform organic solvent film M on the level S. While the pure water J is kept substantially at room temperature, for example, the temperature of the heated organic solvent Z that is fed onto the liquid level S is much higher than that of the pure water J. The difference in temperature between the solvent z and the water J is scores of degrees or more.

Figure 8:
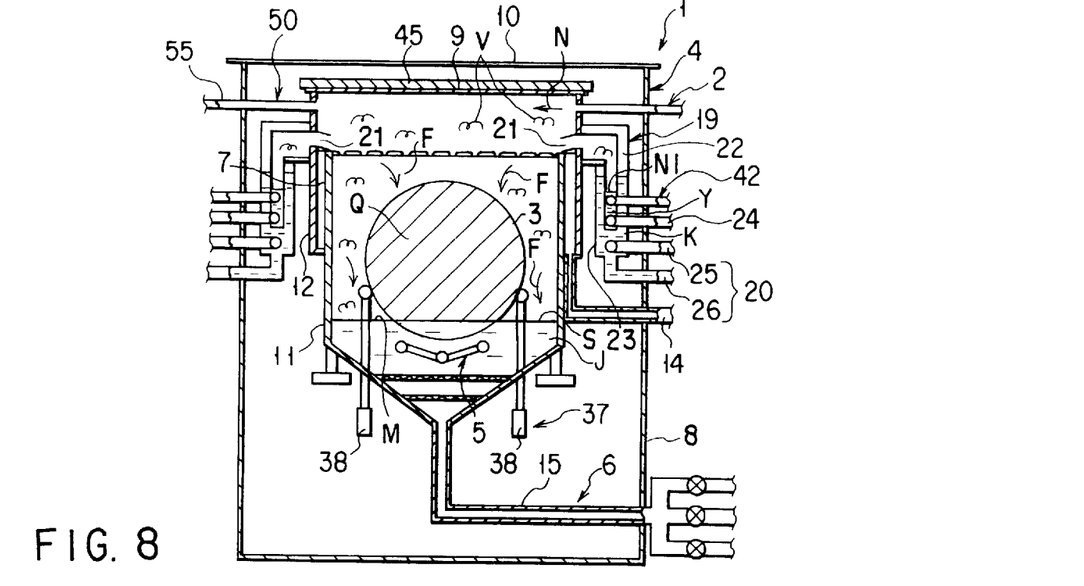
FIG. 8 is a vertical sectional view showing the drying apparatus of FIG. 1 with its lifter raised.
Figure 9:
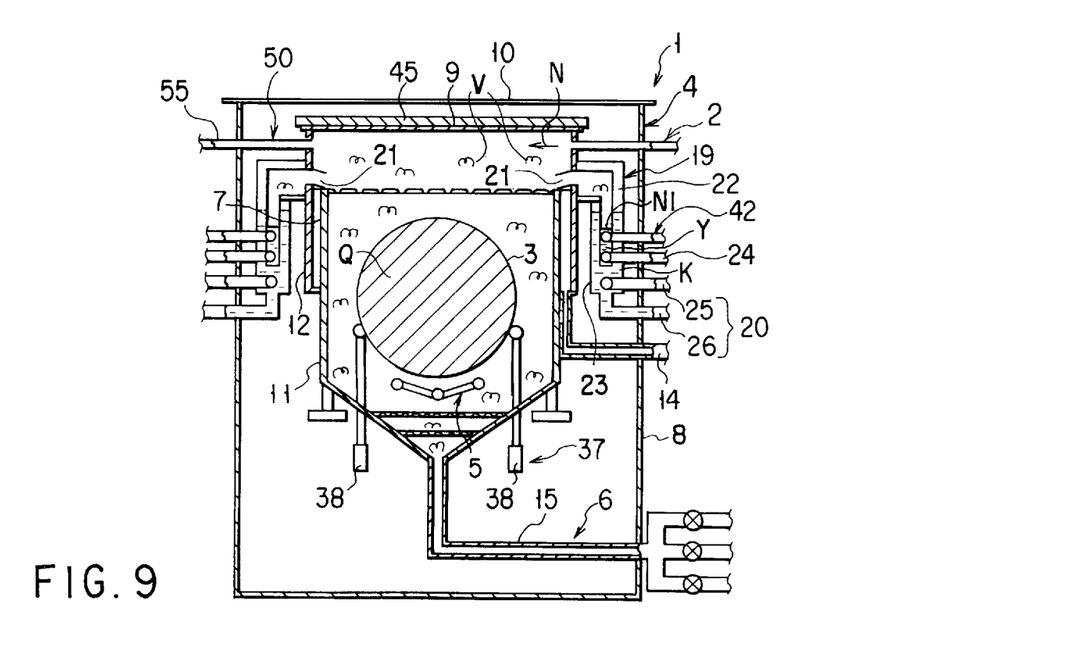
FIG. 9 is a vertical sectional view showing the drying apparatus of FIG. 1 with its drying vessel from which treatment liquid is evacuated.

The holding member 5 in the vessel body 11 can hold the wafer 3, which is loaded into the vessel body 11 by means of the transportation device 100, in a vertical posture. The lifter 37 is provided with movable arms 38 that are movable in the vertical direction. In the drying vessel 7, the arms 38 can be moved between a down position shown in FIGS. 1 to 7 and an up position shown in FIGS. 8 and 9. When the arms 38 are in the down position, the wafer 3 is held by means of the holding member 5. When the arms 38 are moved to the up position, as shown in FIGS. 8 and 9, the wafer 3 is disengaged from the holding member 5.

The following is a description of the operation of the drying apparatus 1. FIG. 2 shows a standby process in which loading the to-be-dried object (wafer 3) is awaited. In this standby process, the pure water J is fed from the treatment liquid source 97 into the vessel body 11 through the inlet-outlet pipe 15. The pure water J that overflows the top opening 13 of the vessel body 11 flows into the overflow tank 12, and is guided through the drain pipe 14 to the outside of the apparatus body 4. The interior of the drying vessel 7 is cleaned with the pure water J that flows into, and overflows the vessel body 11 in this manner. As this is done, the inert gas N is fed into the drying vessel 7 from above through the gas supply pipe 34 of the first inert gas supplier 2. The inert gas N fills the space over the liquid level S in the drying vessel 7.

Figure 3:
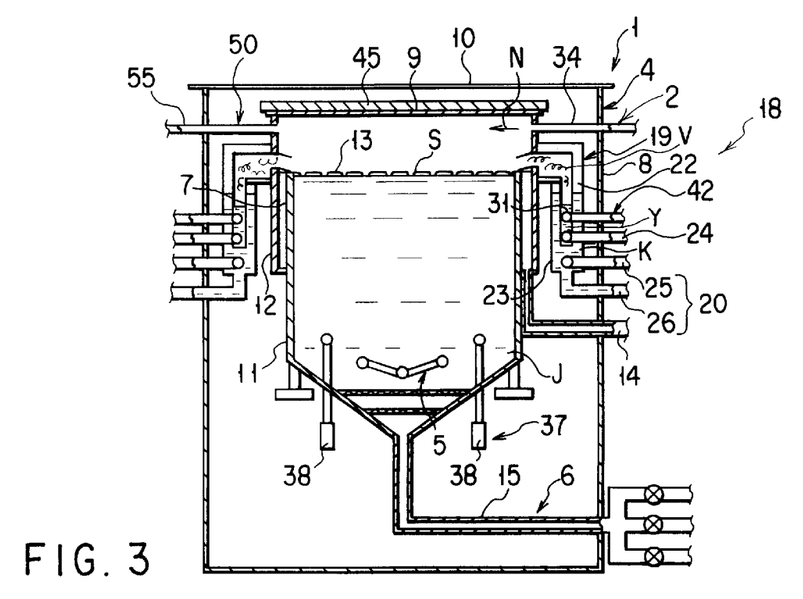
FIG. 3 is a vertical sectional view showing an organic solvent vapor produced in an organic solvent tank of the drying apparatus of FIG. 1.

The high-temperature fluid K, heated to 25° to 85°, for example, is fed into the heating tank 23 of the tank assembly 19 through the fluid supply pipe 25. The fluid K in the heating tank 23 heats the organic solvent tank 22 and is returned to the outside of the apparatus body 4 through the fluid return pipe 26. When the organic solvent Y in a given quantity is fed into the solvent tank 22 through the organic solvent supply pipe 24, as shown in FIG. 3, the heated solvent Y produces the vapor V. In this state, the gas jets of the jet pipe 31 are submerged under the level of the organic solvent Y. Alternatively, the organic solvent vapor V is produced in a manner such that the organic solvent heated by means of the heater 106 shown in FIG. 1 is introduced into the organic solvent tank 22.

Figure 4:
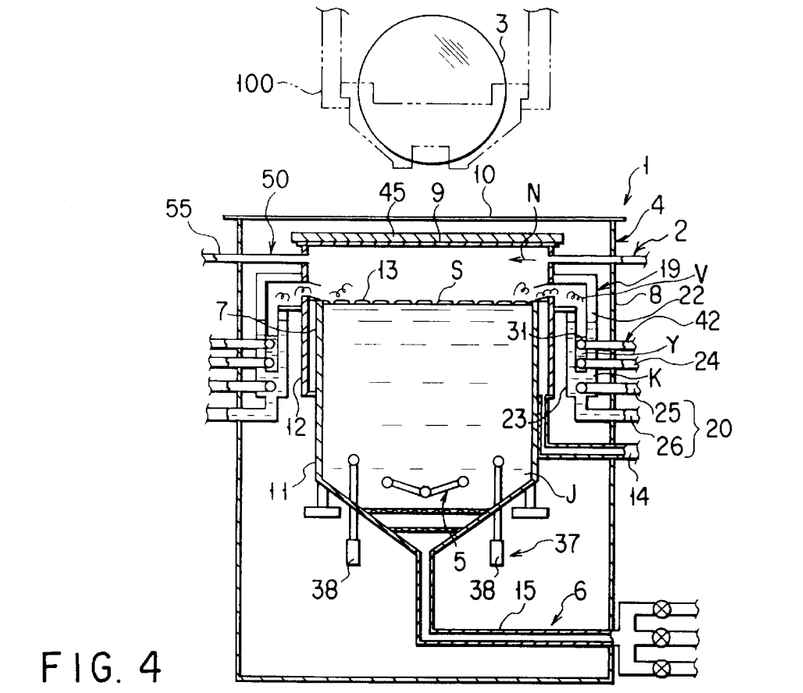
FIG. 4 is a vertical sectional view showing the organic solvent vapor in the drying vessel of the drying apparatus of FIG. 1.
Figure 5:
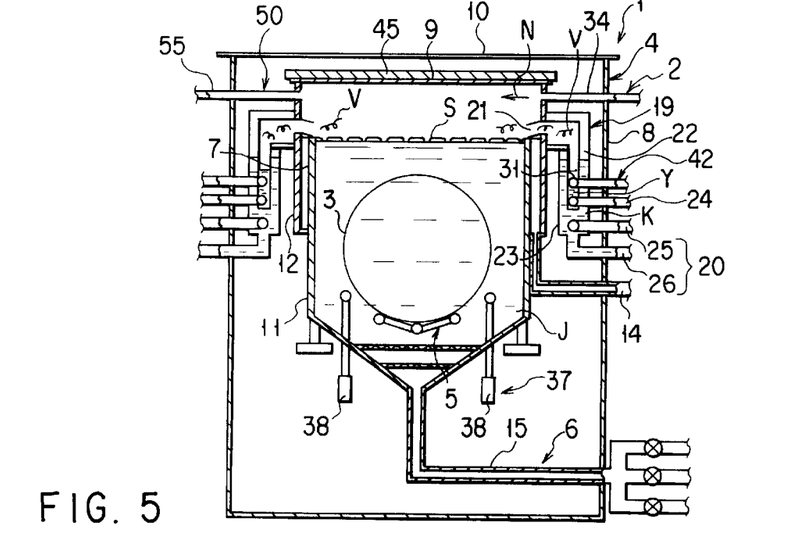
FIG. 5 is a vertical sectional view showing a wafer in the treatment liquid in the drying apparatus of FIG. 1.

As shown in FIG. 4, the cleaned wafer 3 is situated over the drying apparatus 1 by means of the transportation device 100. As shown in FIG. 5, thereafter, the top lid 45 of the drying vessel 7 is taken off, and the wafer 3 is inserted into the vessel 7 by means of the device 100. After the wafer 3 is held by means of the holding member 5, the lid 45 is put on. The first inert gas supplier 2 continues to feed the inert gas N into the drying vessel 7 before the state of FIG. 5 in which the wafer 3 is immersed is reached after the standby state shown in FIG. 2. After the space over the liquid level S in the drying vessel 7 is filled again with the inert gas N, the feed of the pure water J through the inlet-outlet pipe 15 into the vessel 7 is stopped. Thereafter, the position of the liquid level S is slightly lowered by discharging a predetermined portion of the pure water J from the vessel body 11 through the port 11a.

Figure 6:
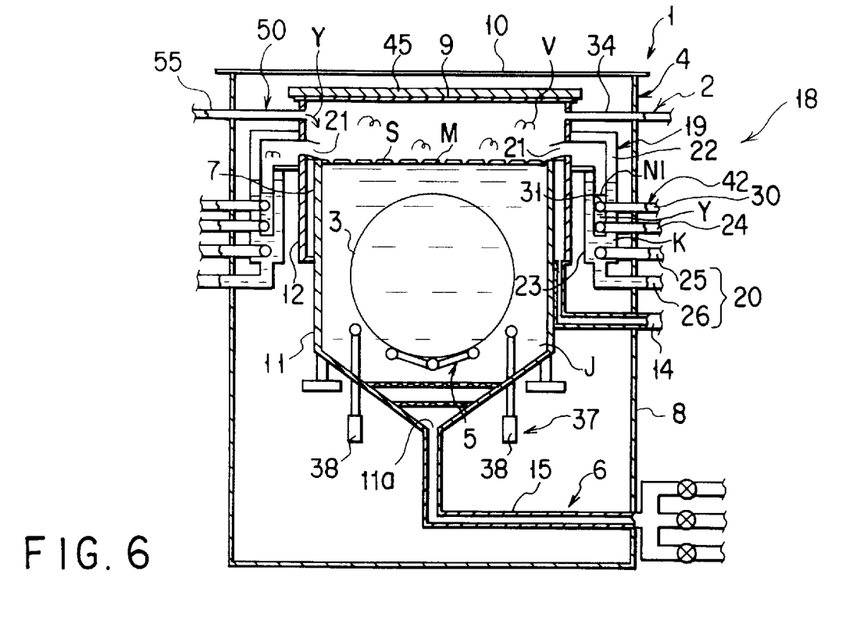
FIG. 6 is a vertical sectional view showing an organic solvent film on the treatment liquid in the drying apparatus of FIG. 1.

As shown in FIGS. 6 and 14, the organic solvent Z (feed: 50 cc to 150 cc) heated to 60° C. to 80° C. is supplied to the trough 111 in the drying vessel 7 through the discharge port 110 of the organic solvent supply pipe 55. The solvent Z fed onto the trough 111 flows through the gap G between the trough 111 and the inner wall 112 and along the whole inner wall 112, and then flows down toward the liquid level S of the pure water J. As the heated organic solvent Z diffuses quickly and uniformly throughout the liquid level S of the pure water J in this manner, the uniform organic solvent film M with a thickness of several millimeters is formed on the pure water level S.

It can be visually ascertained that the organic solvent film M is separated distinctly from the pure water J. Even though the organic solvent vapor V is supplied to the space over the film M, the film M cannot be torn, and its thickness never increases. Since the organic solvent never diffuses into that portion of the pure water J which is situated several millimeters below the organic solvent film M, the organic solvent concentration of the pure water J is substantially 0%.

The supply of the inert gas N through the gas supply pipe 34 of the first inert gas supplier 2 is stopped, and the inert gas N1 is fed into the organic solvent tank 22 through the gas supply pipe 30 of the second inert gas supplier 42. The flow rate of the inert gas N1 to be fed into the tank 22 is adjusted to about 5 to 10 litter per minute. If the flow rate of the inert gas N1 is higher this level, the quantity of the vapor V fed into the drying vessel 7 increases. Although the drying condition for the wafer 3 is improved, therefore, the consumption of the organic solvent increases unfavorably.

The organic solvent vapor V in the organic solvent tank 22 is diluted with the inert gas N1 that is introduced into the tank 22, whereupon the volume of the vapor increases. The vapor V diluted with the gas N1 is introduced into the drying vessel 7 through the slit 21, as shown in FIG. 6. Some of the vapor V is cooled to be condensed by the liquid level S of the pure water J, and merges into the organic solvent film M. Thus, the inert gas N, organic solvent vapor V diluted with the inert gas, organic solvent film M, liquid level S of the pure water mixed with the organic solvent, and pure water J containing no organic solvent are successively formed from top to bottom in the drying vessel 7.

Figure 7:
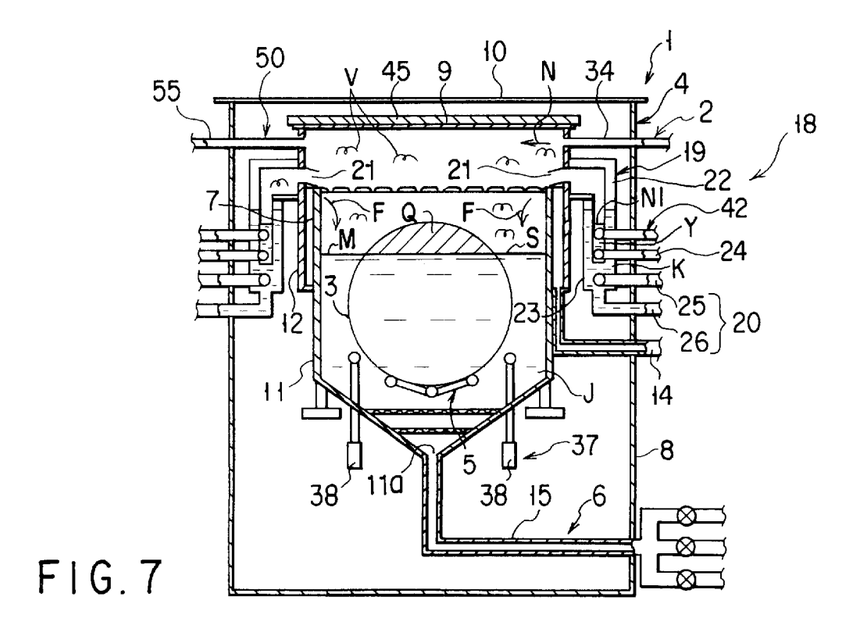
FIG. 7 is a vertical sectional view showing the drying apparatus of FIG. 1 from which some of the treatment liquid is discharged.

As shown in FIG. 7, the pure water J is discharged from the vessel body 11 through the inlet-outlet port 11a and the inlet-outlet pipe 15. As the pure water J is discharged in this manner, its level S lowers, so that the wafer 3 is gradually exposed above the liquid level S, its upper end first. In other words, the wafer 3 rises relatively to the liquid level S. The organic solvent that forms the organic solvent film M continuously adheres to the surface of the wafer 3 that is exposed above the liquid level S. In this state, the organic solvent vapor V also continues to be produced in the organic solvent tank 22, while the second inert gas supplier 42 goes on supplying the inert gas N1. The organic solvent vapor V that is diluted with the inert gas N1 continues to be introduced into the drying vessel 7 through the slit 21.

The vapor V that fills the drying vessel 7 touches the surface of the wafer 3 that is exposed above the liquid level S, whereupon it is rapidly cooled and condensed on the surface of the wafer 3, as indicated by hatching Q in FIG. 7. Since the vapor V is reduced in volume as it is condensed in this manner, a flow of the vapor V toward the liquid level S is generated, as indicated by arrow F in FIG. 7. As the vapor V is condensed on the surface of the wafer 3 and the organic solvent of the organic solvent film M adheres to the surface of the wafer 3, the sufficient organic solvent can be supplied to the wafer surface. The pure water J having so far been adhering to the wafer 3 flows down from the wafer 3 as it is replaced with the organic solvent on the wafer surface. The surface of the wafer 3 is covered with the inert gases N and N1 in the vapor V.

When the upper part of each movable arm 38 is exposed above the liquid level S, as shown in FIG. 8, the arms 38 are raised to support the wafer 3. Thereupon, the wafer 3 is disengaged from the holding member 5. The vapor V that is diluted with the inert gases N and N1 goes on flowing in the direction indicated by arrow F in FIG. 8. When the pure water J is fully discharged from the vessel body 11, the organic solvent adheres to the whole surface of the wafer 3, as indicated by hatching Q in FIG. 9. After the discharge of the pure water J is completed, the normal-temperature or heated inert gas N continues to be supplied from the first inert gas supplier 2 to the vessel body 11 for a given time. The inert gas N1 also continues to be supplied from the second inert gas supplier 42 to the vessel body 11.

Figure 10:
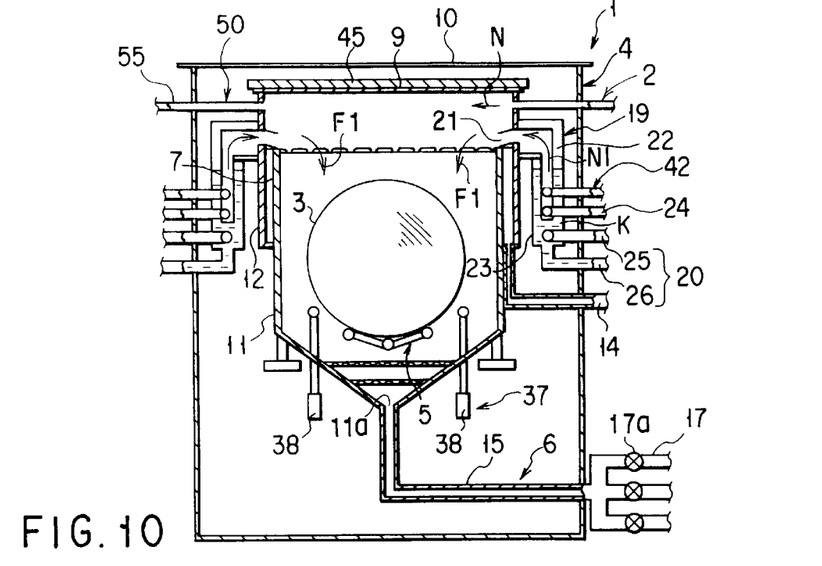
FIG. 10 is a vertical sectional view showing the drying apparatus of FIG. 1 in a state after the completion of a wafer drying process.

As the movable arm 38 descends after the passage of the given time, as shown in FIG. 10, the holding member 5 holds the wafer 3 again. The organic solvent Y in the organic solvent tank 22 is discharged through the organic solvent supply pipe 24 and the like. The normal-temperature or heated inert gas N continues to be supplied from the first inert gas supplier 2. The inert gas N1 fed from the second inert gas supplier 42 into the organic solvent tank 22 is heated with the high-temperature fluid K and fed into the drying vessel 7 through the slit 21.

In a final stage of a drying process shown in FIG. 10, valve 17a is opened and the vapor V remaining in the drying vessel 7 and the gas containing the organic solvent from the surface of the wafer 3 are discharged to the outside of the drying vessel 7 through the exhaust pipe 17. Accordingly, a flow of gas in the direction of arrow F1 in FIG. 10 or toward the inlet-outlet port 11a is generated in the drying vessel 7. As the gas is discharged from the drying vessel 7 in this manner, the organic solvent left on the surface of the wafer 3 evaporates quickly. At the same time, low-temperature pure water is supplied to the overflow tank 12 through supply pipe (not shown) and then discharged through the drain pipe 14, whereupon the vessel body 11 is cooled. As this is done, the removal of the organic solvent from the surface of the wafer 3 is accelerated.

Figure 11:
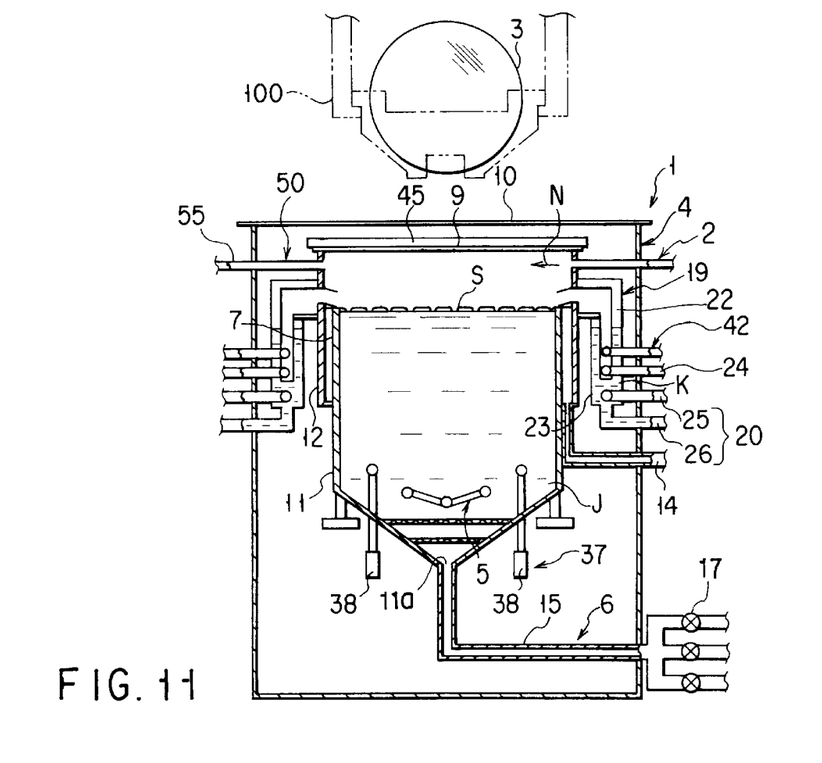
FIG. 11 is a vertical sectional view showing the drying vessel of the drying apparatus of FIG. 1 supplied with the treatment liquid after the removal of the wafer.

After the wafer 3 is dried, the supply of the inert gases N and N1 by means of the inert gas suppliers 2 and 42 is stopped. The lid 45 is taken off, as shown in FIG. 11, and the wafer 3 is unloaded from the drying vessel 7 by means of the transportation device 100. The device 100 transfers the wafer 3 to the next process. After the wafer 3 is carried out from the drying vessel 7, the pure water J is fed again into the vessel 7 through the inlet-outlet pipe 15. The standby state shown in FIG. 2 is restored as the inert gas N is supplied to the space over the pure water J by means of the first inert gas supplier 2. Thereafter, the wafer 3 is dried by repeating the drying process shown in FIGS. 3 to 10.

In this drying apparatus 1, the pure water J introduced into the drying vessel 7 through the inlet-outlet port 11a at the bottom of the vessel body 11 overflows the top of the vessel 7. The overflown pure water J is discharged from the drying vessel 7. The drying vessel 7 is cleaned with the flow of the pure water J, and particles in the vessel 7 are removed securely.

In the drying apparatus 1, the first and second inert gas suppliers 2 and 42 feed the inert gases N and N1 into the drying vessel 7. Thus, the space over the pure water J in the drying vessel 7 is filled with the organic solvent vapor V that is diluted with the inert gases N and N1. The inert gases N and N1 and the organic solvent vapor V allow the wafer 3 to avoid from touching oxygen in air. Accordingly, the surface of the wafer 3 can be prevented from suffering watermarks that are attributable to oxidation.

In the drying apparatus 1, the drying vessel 7 is filled with the pure water J, and the surface of the wafer 3 is gradually exposed above the liquid level S as the water J is discharged from the vessel 7 after the wafer 3 is submerged in the water J. The organic solvent vapor V is condensed on the exposed surface of the wafer 3. The pure water J having so far been adhering to the surface of the wafer 3 is replaced with the organic solvent and flows down. In this case, at least a part of the wafer 3 is immersed in the pure water J until the organic solvent is condensed on the whole surface of the wafer 3. If the latent heat of the organic solvent is generated on the surface of the wafer 3, therefore, wafer 3 can be kept at a low temperature. Thus, the temperature of the wafer 3 can be kept lower enough than that of the vapor V before the organic solvent is condensed on the whole surface of the wafer 3, so that the solvent can be condensed securely on the surface of the wafer 3.

In the drying apparatus 1, moreover, the uniform organic solvent film M can be formed on the liquid level S of the pure water J as the heated organic solvent Z is fed onto the liquid level S of the pure water J. Since the surface of the wafer 3 never fails to pass through the organic solvent film M as the wafer 3 is exposed above the liquid level S, therefore, the organic solvent that forms the film M adheres substantially uniformly to the wafer surface without a break. At the same time, the organic solvent vapor V continues to be fed from the organic solvent tank 22 into the drying vessel 7, so that vapor V that is directed to the liquid level S is condensed on the surface of the wafer 3. Owing to the synergism of these phenomena, the sufficient organic solvent for the removal of the particles can be condensed continuously on the surface of the wafer 3. Thus, the particles can be removed securely, and production of watermarks can be prevented.

In the drying apparatus 1, the second inert gas supplier 42 supplies the inert gas N1 to the organic solvent Y in the organic solvent tank 22. The organic solvent vapor V in the tank 22 is diluted with the inert gas N1. Accordingly, the drying process requires only a small consumption of the organic solvent, so that the cost for the drying process can be lowered. Since the inert gas N1 is introduced into the organic solvent vapor V, moreover, the volume of the vapor V increases. If the organic solvent vapor V is consumed as it is condensed on the surface of the wafer 3, therefore, the wafer 3 never fails to be covered with the vapor V, so that production of watermarks can be restrained.

In the drying apparatus 1 according to this embodiment, the stable organic solvent film M that cannot be easily torn is formed on the liquid level S of the pure water J by means of organic solvent film forming means shown in FIG. 14. Since the organic solvent never diffuses into the underside of the film M, only that portion of the pure water J from the inlet-outlet port 11a of the drying vessel 7 which contains the organic solvent near the film M should be abandoned. Most of the pure water J under the film M can be reused in the drying process after being re-treated. Thus, the consumption of the pure water J in the drying process can be restrained.

As shown in FIGS. 8 and 9, the wafer 3 is disengaged from the holding member 5 by means of the movable arm 38 while the pure water J is being discharged from the drying vessel 7, so that the pure water can be prevented from remaining in the area of contact between the wafer 3 and the member 5. Thus, production of watermarks can be prevented more securely.

The drying apparatus and the drying method according to the present invention are not limited to the embodiment described herein. The invention is also applicable to the way of drying any other to-be-dried objects than semiconductor wafers, including various substrates such as glass substrates for liquid crystal displays and substrates for optical and magnetic recording disks, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A drying apparatus for drying, a cleaned to-be-dried object, comprising:

a drying vessel for storing the to-be-dried object;

a treatment liquid feeder-discharger feeding a treatment liquid into the drying vessel and discharging the treatment liquid in the drying vessel from the bottom side thereof;

a heated organic solvent supplier for feeding a heated organic solvent onto the treatment liquid in the drying vessel said heated organic solvent supplier comprising:
a heater for heating the organic solvent to a temperature higher than a temperature of the treatment liquid in the drying vessel by 20° C. or more;
a discharging mechanism for discharging the organic solvent heated by the heater to the treatment liquid from an upper part of the drying vessel; and
an organic solvent diffusion mechanism for uniformly supplying the organic solvent discharged from the discharging mechanism onto an entire liquid level of the treatment liquid, said organic solvent diffusion mechanism having an inner wall of the drying vessel and a trough, which extends along the inner wall in a horizontal direction and is located between the discharging mechanism and the liquid level of the treatment liquid, a gap being defined between the trough and the inner wall, and the heated organic solvent being discharged onto the trough and falling from the gap along the inner wall, thereby uniformly forming a film of the heated organic solvent over the liquid level of the treatment liquid; and a vapor supplier for feeding an organic solvent vapor into the drying vessel.

2. A drying apparatus according to claim 1, wherein said treatment liquid to be fed into the drying vessel is pure water, and said organic solvent is isopropyl alcohol.

3. A drying apparatus according to claim 1, wherein said treatment liquid feeder-discharger includes an inlet-outlet port opening in the base portion of the drying vessel, an inlet-outlet pipe connected to the inlet-outlet port, a valve, and a treatment liquid source.

4. A drying apparatus according to claim 1, wherein said vapor supplier includes a first inert gas supplier for introducing a normal-temperature or heated inert gas into the drying vessel through the top portion thereof.

5. A drying apparatus according to claim 1, wherein:
said vapor supplier comprises:
an organic solvent tank storing the organic solvent provided at an upper part of the drying vessel, and having a communication portion providing fluid communication between the organic solvent tank and an interior portion of the drying vessel;
an organic solvent storage tank having the heater stored therein and being provided at a position different from a position where the drying vessel is located; and
an organic solvent supply pipe for introducing an organic solvent heated by the heater from the organic solvent storage tank to the organic solvent tank, and organic solvent vapor, which is generated from the heated organic solvent supplied to the organic solvent tank, is supplied to the drying vessel from the communication portion.

6. A drying apparatus according to claim 5, further comprising a second inert gas supplier for introducing an inert gas into the organic solvent stored in the organic solvent tank.

7. A drying apparatus according to claim 1, wherein said drying vessel contains therein the organic solvent vapor diluted with an insert gas, the organic solvent film, the treatment liquid level, and the treatment liquid, put in order from top to bottom.

8. A drying apparatus according to claim 1, further comprising a holding member located in the drying vessel and capable of engaging a part of the to-be-dried object, thereby holding the object, and a lifter located for up-and-down motion in the drying vessel and adapted to support and raise the to-be-dried object, thereby separating the to-be-dried object from the holding member, while the treatment liquid level is lowering as the treatment liquid is discharged from the drying vessel.

* * * * *